(12) United States Patent
Song et al.

(10) Patent No.: US 7,653,167 B2
(45) Date of Patent: Jan. 26, 2010

(54) PHASE DEGLITCH CIRCUIT FOR PHASE INTERPOLATOR FOR HIGH-SPEED SERIAL I/O APPLICATIONS

(75) Inventors: Hongjiang Song, Mesa, AZ (US); Tofayel Ahmed, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 595 days.

(21) Appl. No.: 11/517,162

(22) Filed: Sep. 7, 2006

(65) Prior Publication Data

US 2008/0063124 A1    Mar. 13, 2008

(51) Int. Cl.
*H04L 7/00* (2006.01)
*H04L 25/00* (2006.01)
*H04L 25/40* (2006.01)

(52) U.S. Cl. .................. 375/371; 375/219; 375/324; 375/325; 375/326; 375/327; 375/328; 327/231; 327/232; 327/233; 327/234; 327/235; 327/236; 327/237; 327/247; 327/249; 327/356; 327/359; 327/119; 327/120; 327/121

(58) Field of Classification Search ............ 375/219, 375/324–328, 371; 327/231–237, 249, 247, 327/356, 359, 119, 120, 121
See application file for complete search history.

(56) References Cited

U.S. PATENT DOCUMENTS

| | | | |
|---|---|---|---|
| 6,359,486 B1 * | 3/2002 | Chen | 327/231 |
| 6,539,072 B1 * | 3/2003 | Donnelly et al. | 375/371 |
| 6,949,958 B2 * | 9/2005 | Zerbe et al. | 327/3 |
| 7,256,627 B1 * | 8/2007 | Talbot et al. | 327/141 |
| 2006/0008041 A1 * | 1/2006 | Kim et al. | 375/371 |

* cited by examiner

*Primary Examiner*—Mohammad H Ghayour
*Assistant Examiner*—Sung Ahn
(74) *Attorney, Agent, or Firm*—Lee & Hayes, PLLC

(57) ABSTRACT

Various embodiments provide a Phase Interpolator (PI) that receives input clocks, and outputs intersymbol interference-equalized, phase-shifted output clocks. In one embodiment, the Phase Interpolator comprises two PI Conditioners and a PI Mixer. In one embodiment, a PI Conditioner receives input clocks and is controlled by a different phase-shifted input clock by using a suitable circuit element, such as a flip-flop. Collectively, the input clock-controlled PI Conditioner and Mixer act in concert to control the band limiting effect of the PI Conditioner which, in turn, equalizes intersymbol interference.

8 Claims, 12 Drawing Sheets

PHASE DEGLITCH CIRCUIT FOR PHASE INTERPOLATOR FOR HIGH-SPEED SERIAL I/O APPLICATIONS

BACKGROUND

Phase interpolator based data recovery circuits are commonly used in high speed serial I/O links to recover data signals that have become distorted due to noise or attenuation. In a typical data recovery circuit, three identical phase interpolator circuits are often used. Thus, in order to minimize the layout area, segmented phase interpolator circuits, consisting of two circuit stages, are often implemented to allow for high-resolution phase interpolation. However, this segmented phase interpolator circuit design has shown a high level of non-linearity during what is known as inter-quadrant switching. Specifically, some existing segmented phase interpolator circuits have shown 30 ps phase non-linearity during inter-quadrant switching which is high when compared to a desirable step adjustment target of 6.6 ps. This high non-linearity caused by inter-quadrant switching has been shown to introduce a significant amount of jitter into the phase interpolator based data recovery circuit.

DETAILED DESCRIPTION

Various embodiments provide a Phase Interpolator (PI) that receives input clocks, and outputs intersymbol interference-equalized, phase-shifted output clocks. In one embodiment, the Phase Interpolator comprises two PI Conditioners and a PI Mixer. In one embodiment, a PI Conditioner receives input clocks and is controlled by a different phase-shifted input clock by using a suitable circuit element, such as a flip-flop. Collectively, the input clock-controlled PI Conditioner and Mixer act in concert to control the band limiting effect of the PI Conditioner which, in turn, equalizes intersymbol interference.

Figure 1:
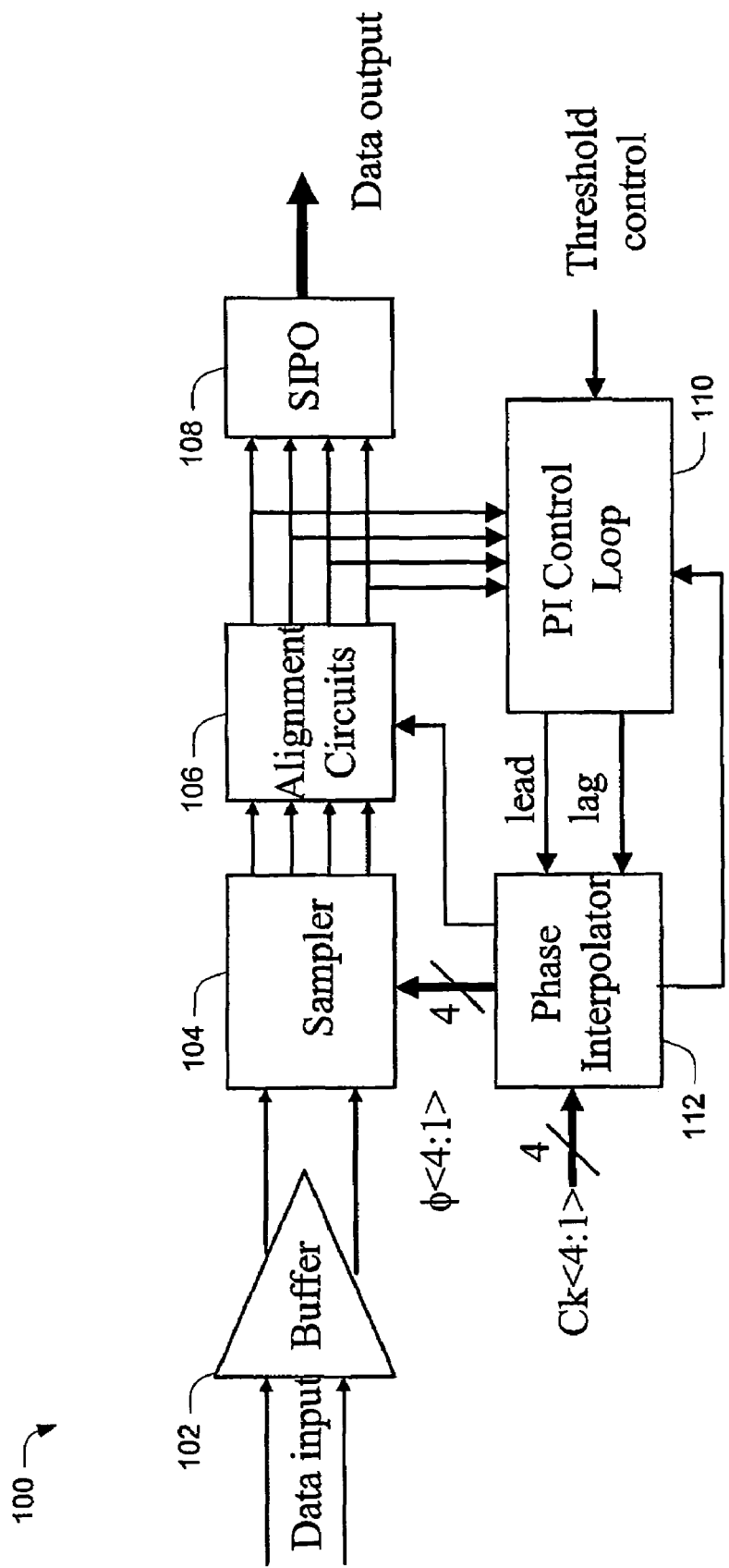
FIG. 1 illustrates a typical phase interpolator based data recovery circuit.

As some background for an appreciation of a common phase interpolator based data recovery circuit, consider the following in connection with FIG. 1.

FIG. 1 illustrates, generally at 100, a phase interpolator-based data recovery circuit. Circuit 100 includes a buffer 102, a sampler 104, alignment circuits 106, serial-in-parallel-out (SIPO) logic circuit block 108, PI Control Loop 110 and Phase Interpolator 112.

In this example, buffer 102 is designed to receive data input which is then provided to sampler 104. Sampler 104 provides sampled output to alignment circuits 106 whose output is provided to both SIPO block 108 and PI Control Loop 110. The output of the SIPO block is the data output constituting the recovered data.

Continuing, PI Control Loop 110 receives a threshold control input and provides a so-called lead and lag output which is provided to Phase Interpolator 112. The Phase Interpolator receives four clock inputs and provides, as output, four output signals which are provided to sampler 104, and an output to alignment circuits 106.

In this particular example, Phase Interpolator 112 takes as input 4-Phase Rx Phase Loaded Loop (PLL) clocks {Ck1, Ck2, Ck3, Ck4}. As will be further described below, Phase Interpolator 112 outputs 4-phase output clocks {($\phi1$, $\phi2$, $\phi3$, $\phi4$} which correspond to clocks {Ck1, Ck2, Ck3, Ck4} phase shifted by 45 degrees respectively.

Typically, three identical PI circuits are implemented for each data recovery circuit. As such, segmented PI circuit structures are often used in order to minimize the layout area.

Figure 2:
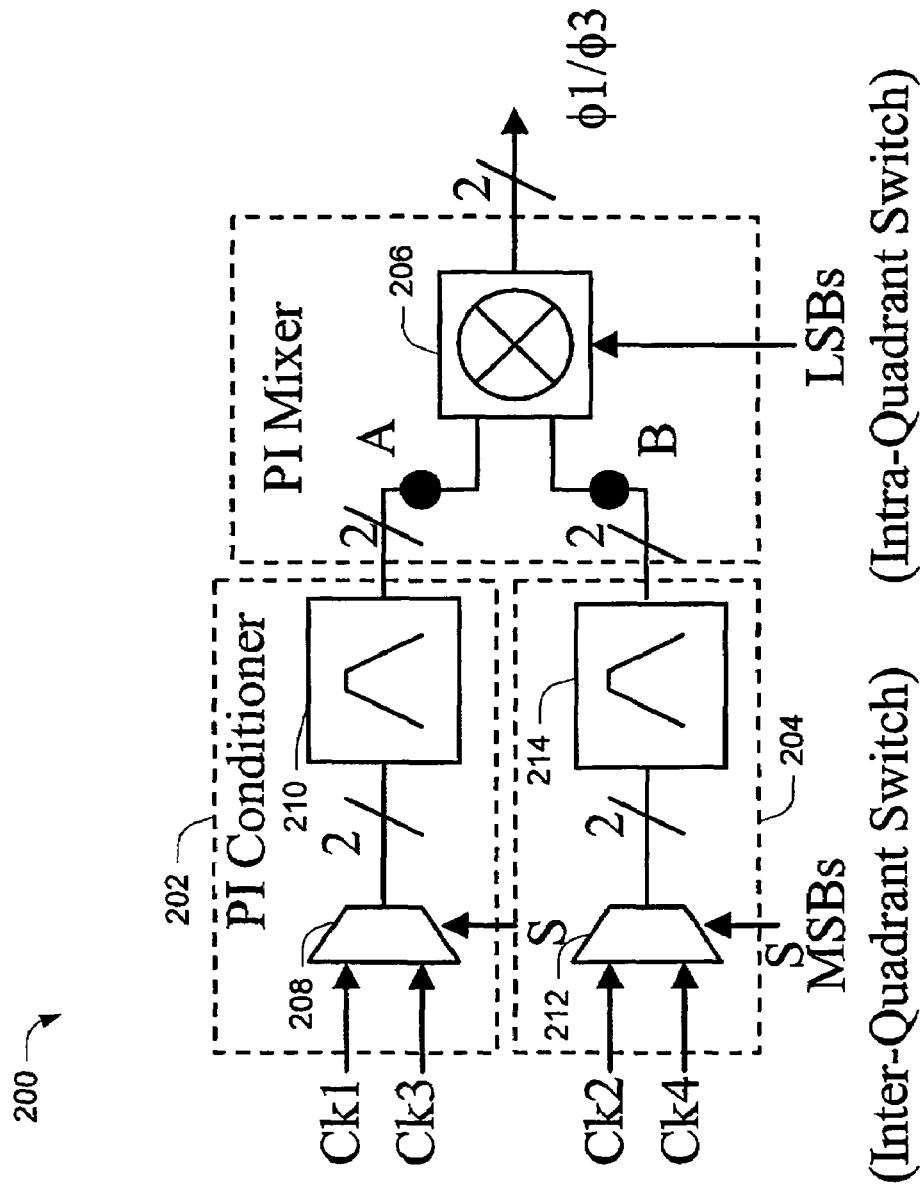
FIG. 2 illustrates a two-stage phase interpolator circuit structure.

FIG. 2 illustrates a block diagram of an existing two-stage Phase Interpolator, generally at 200. Notice that Phase Interpolator 200 could be implemented in phase interpolator based data recovery circuit 100 (FIG. 1) as Phase Interpolator 112.

Here, Phase Interpolator 200 includes PI Conditioners 202 and 204, both of which are coupled to PI Mixer 206, as shown. PI Conditioner 202 includes a digital 2-to-1 MUX 208 which is operably coupled to filter 210. Either a lowpass or bandpass filter may be used. Similarly, PI Conditioner 204 includes a digital 2-to-1 MUX 212 which is operably coupled to filter 214. In this example, the digital MUXs are used for inter-quadrant phase switching while the filters are used for phase interpolator mixing pre-conditioning, as will be appreciated by the skilled artisan. Notice that PI Conditioners 202 and 204 take 4-Phase Rx PLL clocks {Ck1, Ck2, Ck3, Ck4} as well as control signal, S, as inputs. Specifically, PI Conditioner 202 takes Ck1, Ck3 and S as inputs, while PI Conditioner 204 takes Ck2, Ck4, and S as inputs.

PI Mixer 206 realizes the phase mixing operation which is used for the intra-quadrant phase adjustment. Notice that PI mixer 206 takes as input the outputs of PI Conditioner 202 and 204 and outputs phase shifted clocks $\phi1$ and $\phi3$.

Figure 3:
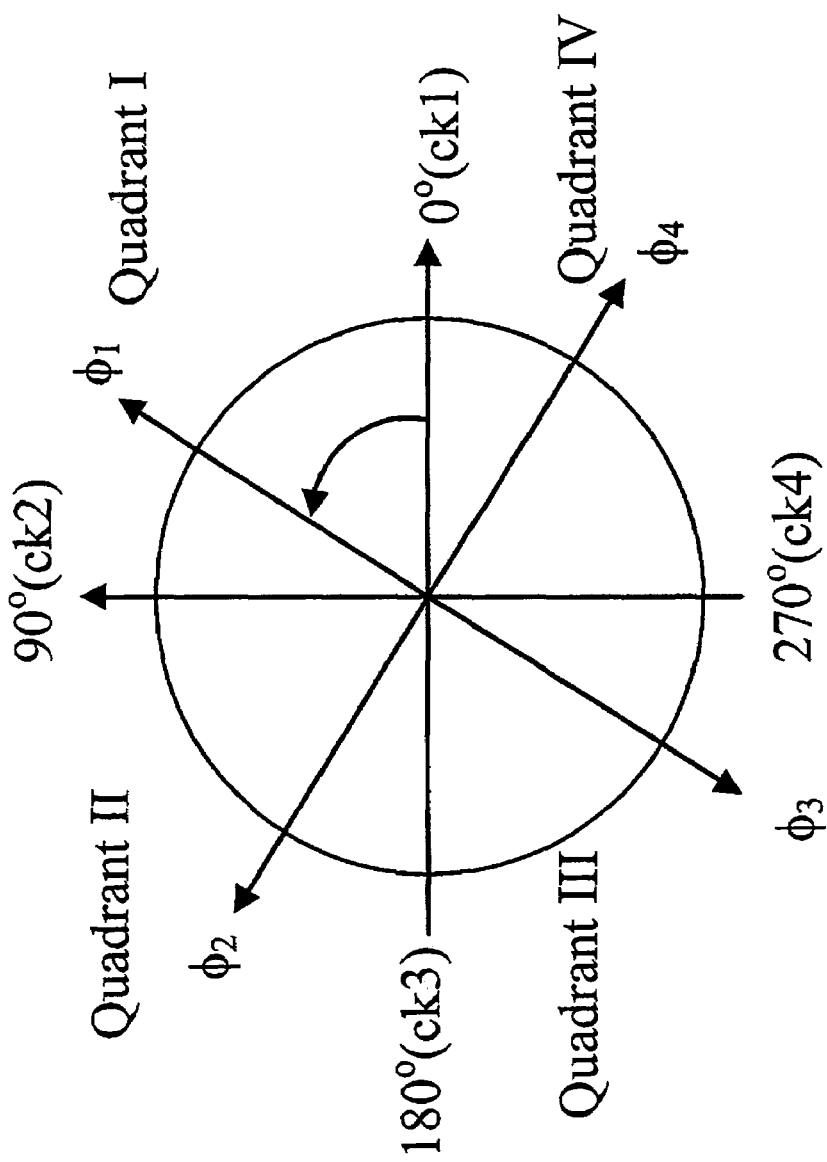
FIG. 3 illustrates a 360 degree diagram of input PLL clocks {Ck1, Ck2, Ck3, Ck4} and phase shifted output clocks {$\phi1$, $\phi2$, $\phi3$, $\phi4$}.

FIG. 3 illustrates a 360-degree diagram of input PLL clocks {Ck1, Ck2, Ck3, Ck4} and phase shifted output clocks {$\phi1$, $\phi2$, $\phi3$, $\phi4$}. Notice that phase shifted output clocks {$\phi1$, $\phi2$, $\phi3$, $\phi4$} correspond to input PLL clocks {Ck1, Ck2, Ck3, Ck4} phase shifted by 45 degrees. Shifting the input PLL clocks by 45 degrees ensures that data will be sampled at the center of the input data eye, as will be appreciated by the skilled artisan. Accordingly, $\phi1$ is located between Ck1 and Ck2, and $\phi3$ is located between Ck3 and Ck4, and so forth. This is consistent with FIG. 2 which shows that when control signal S is low, Mixer 206 will output $\phi1$, which is between Ck1 and Ck2. Similarly, when control signal S is high, mixer 206 will output $\phi3$, which is between Ck3 and CK4.

One of the fundamental issues in existing segmented phase interpolator circuit implementations is the high non-linearity that occurs during inter-quadrant switching resulting from the carry (or borrow) operation across the MSBs and LSBs boundary, as will be appreciated by the skilled artisan.

Figure 4:
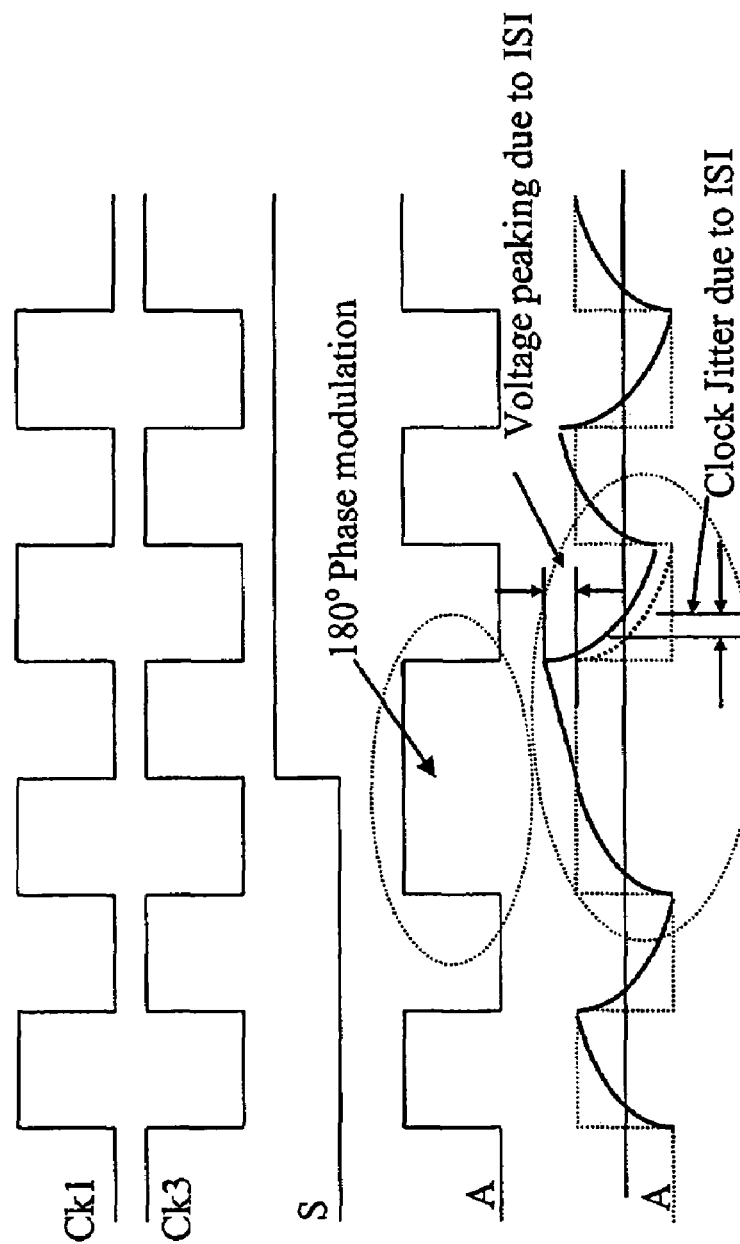
FIG. 4 illustrates the input and output waveforms of a Phase Interpolator Conditioner.

FIG. 4 illustrates how clock jitter is caused by inter-quadrant switching and shows the input signals to PI Conditioner 202: Ck1, Ck3 and control signal S. Signal A corresponds to the output of PI Conditioner 202. Notice that Ck1 and Ck3's phases are 180 degrees apart, which is consistent with FIG. 3. Accordingly, when Ck1 is high, Ck3 is low. Conversely, when Ck3 is high, Ck1 is low. Recall that control signal S controls which clock signal will be sent through MUX 208. Accordingly, when S is low, Ck1 is sent through MUX 208. Therefore, FIG. 4 illustrates that when S is low, A corresponds to Ck1. Notice however that S switches to high when both Ck1 and Ck3 are high. This causes 180 degree phase modulation because the periods of Ck1 and Ck3 are combined. This in turn causes intersymbol interference because there is a change in the clock period of signal A. As illustrated, the intersymbol interference subsequently causes voltage peaking and clock jitter, which are undesirable. Accordingly, there is a need to reduce intersymbol interference in data recovery circuits.

Figure 5:
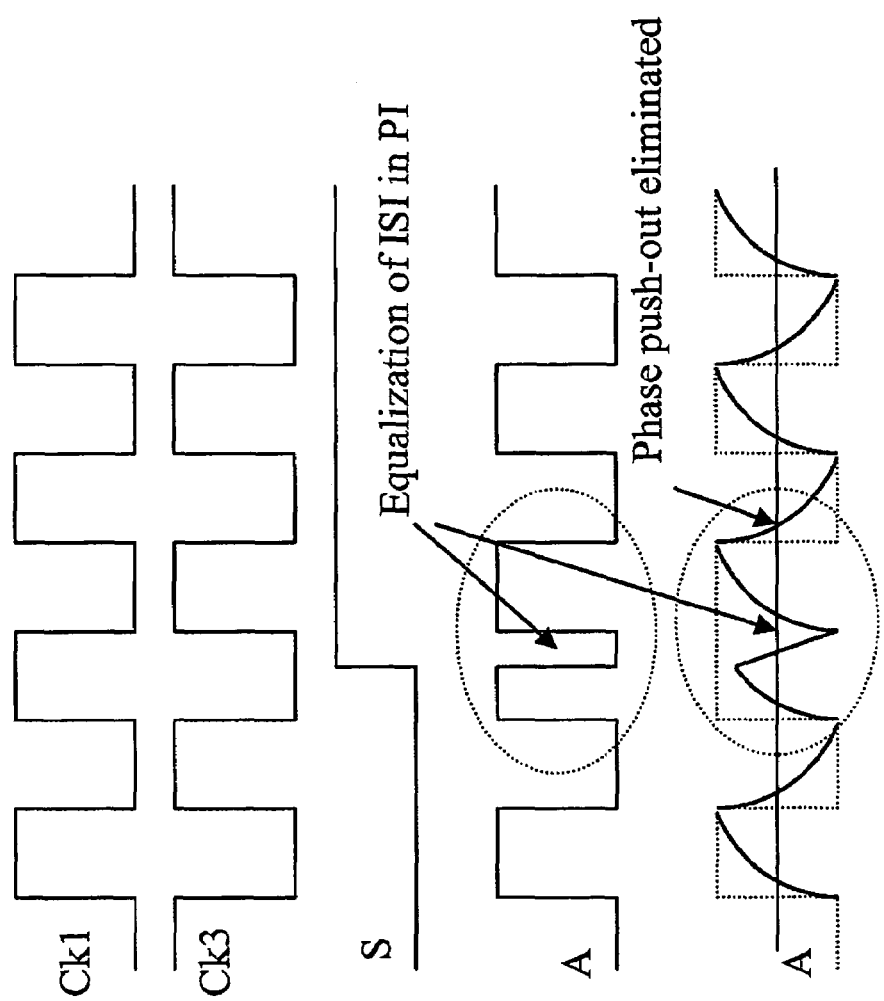
FIG. 5 illustrates the input and output waveforms of a Phase Interpolator Conditioner with Intersymbol Interference Equalization in accordance with one embodiment.

Equalization is one way to reduce the impact of intersymbol interference. FIG. 5 illustrates a Phase Interpolator Equalization scheme embodiment which can be used to control the band-limiting effect of the PI conditioner through an equalization process. As illustrated in FIG. 5, a small pulse of opposite polarity is purposely introduced during the inter-quadrant switching in the phase interpolation. Such an operation is equivalent to high-pass filtering which is used to equalize the band-limiting effect of the PI conditioner. As the result, the phase push-out of the PI conditioner due to intersymbol interference can be minimized or eliminated. This phase interpolator equalization scheme can be easily implemented into current phase interpolator circuits through a suitable circuit modification.

Figure 6:
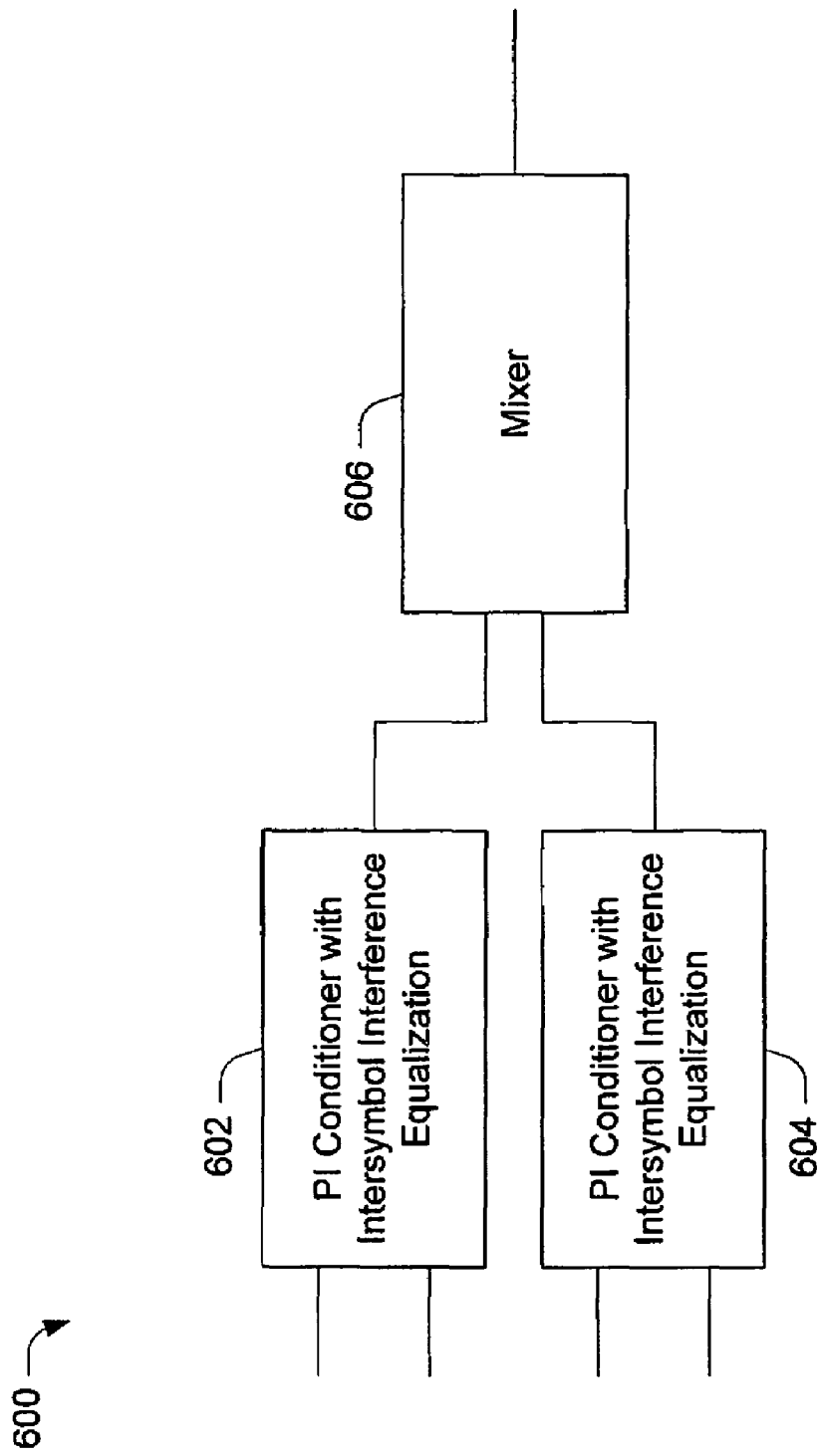
FIG. 6 illustrates a block diagram of a Phase Interpolator Conditioner with Intersymbol Interference Equalization.

FIG. 6 illustrates a system in accordance with one embodiment generally at 600. Here, system 600 includes components in the form of Phase Interpolator Conditioner with Intersymbol Interference Equalization components 602, 604 respectively whose output is received by a mixer 606. System 600 acts to reduce or minimize the phase push-out of the PI conditioner due to intersymbol interference by equalizing the band-limiting effect of the PI conditioner. Components 602, 604 are designed to reduce the amount of intersymbol interference that occurs in current PI Conditioners and, accordingly, can replace Phase Interpolator Conditioners 202 and 204 in FIG. 2.

The discussion that follows presents an exemplary PI Conditioner with Intersymbol Interference Equalization component in accordance with one embodiment. It is to be appreciated and understood that the discussion below constitutes but one exemplary implementation and is not to be used to limit application of the claimed subject matter.

Exemplary Phase Interpolator Embodiment

In one embodiment, the switch timing of the MUXs in the PI Conditioner is modified so that it is adaptively controlled based on the phase of the input PLL clock instead of the phase of the PI output clock. This is accomplished by re-timing the MUX control signal using a 90 degree phase-shifted clock of the PI Input clocks. Such a timing arrangement will introduce the switch pulse shown in FIG. 5 which, in turn, is used to equalize the band-limiting effect of the PI conditioner. As a result, the phase push-out of the phase interpolator conditioner due to intersymbol interference is minimized.

Figure 7:
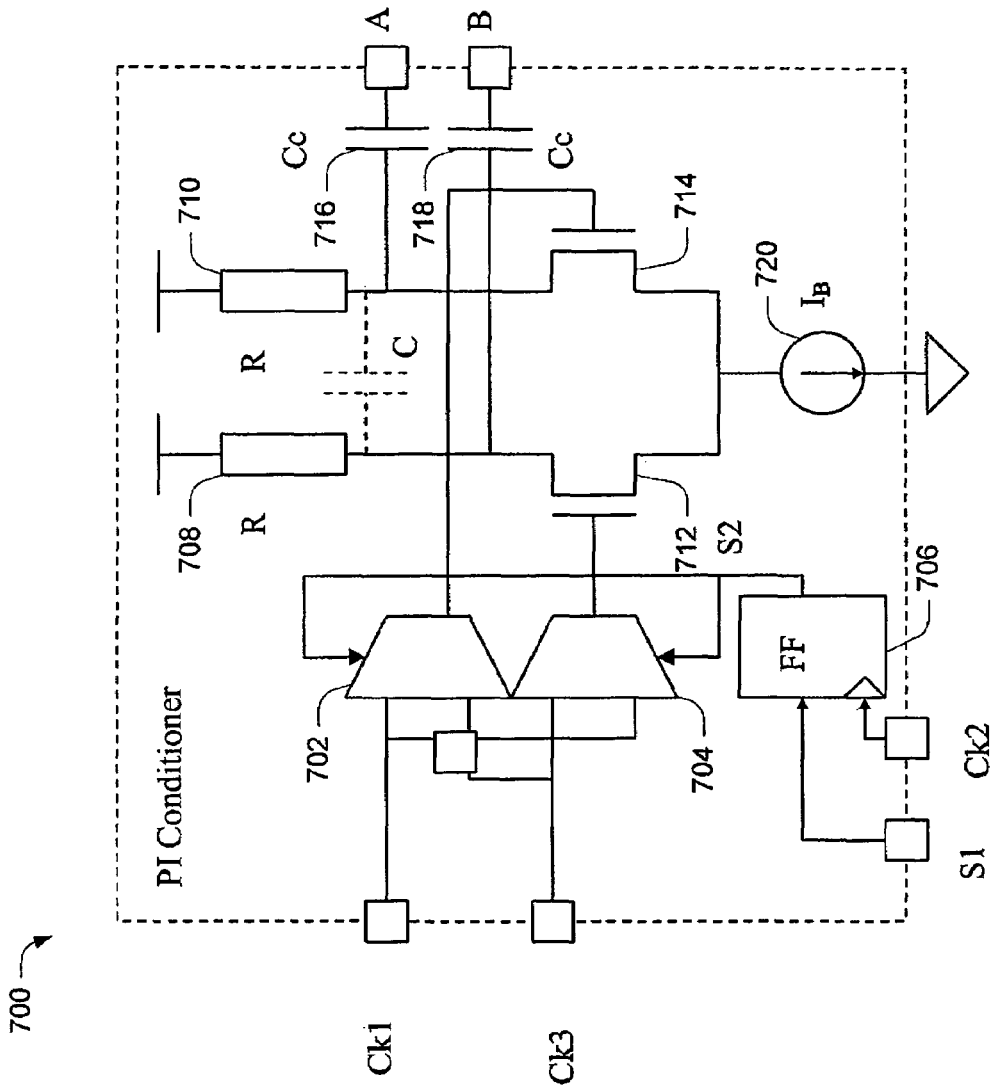
FIG. 7 illustrates a circuit diagram of a Phase Interpolator Conditioner with Intersymbol Interference Equalization, in accordance with one embodiment.

FIG. 7 illustrates a single PI Conditioner with Intersymbol Interference Equalization component in accordance with one embodiment, generally at 700. It is to be appreciated that component 700 can be easily implemented into the existing phase interpolator circuit, shown at FIG. 2, through a suitable circuit modification. Component 700 includes, in this example, 2-to-1 MUXs 702 and 704, which are operably coupled to an amplifier circuit comprising resistors 708 and 710, transistors 712 and 714, and capacitors 716 and 718 as shown. It is to be appreciated and understood that any suitable amplifier circuit may be used.

In order to modify the switch timing of the MUXs in system 700 so that they are adaptively controlled based on the phase of the input PLL clock phase instead of the phase of the PI output clock, Ck2 is used because Ck2 is a 90-degree phase shifted clock of both Ck1 and Ck3. Multiple ways of controlling MUXs 702 and 704 with Ck2 can be used. However, in this particular example, a flip-flop 706 is used. Accordingly, in this embodiment, MUXs 702 and 704 are controlled via a control signal S2 which is output by flip flop 706 which receives Ck2 and a control signal S1 as inputs.

Figure 8:
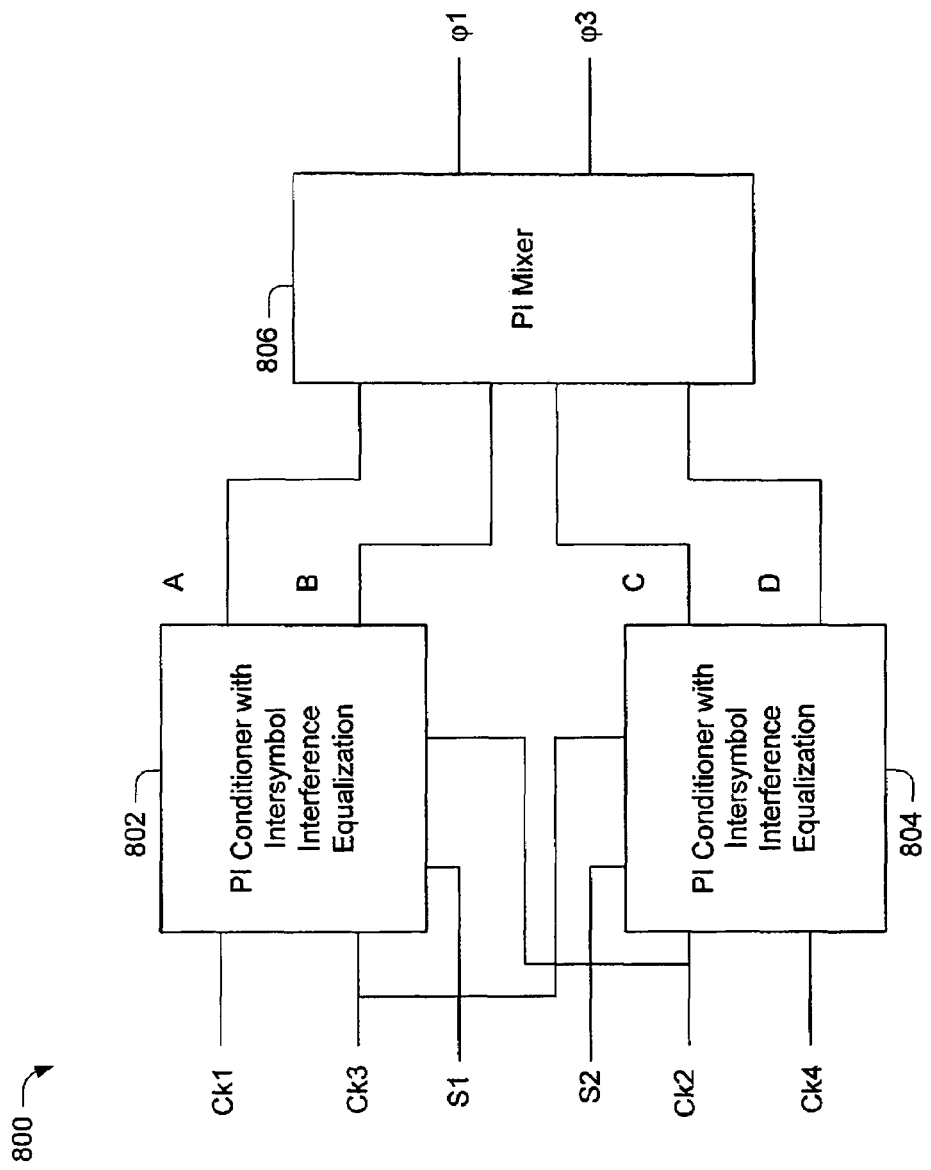
FIG. 8 illustrates a block diagram of a Phase Interpolator with Intersymbol Interference Equalization, in accordance with one embodiment.

FIG. 8 illustrates an exemplary system, generally at 800, that can utilize Phase Interpolator with Intersymbol Interference Equalization components in accordance with one embodiment. In this embodiment, each PI Conditioner with Intersymbol Interference Equalization component 802, 804 is implemented by circuitry such as that shown and described in connection with system 700 in FIG. 7. Hence, component 802 is essentially an abstracted version of system 700, and component 804 is an abstracted version of system 700, except with the different inputs and outputs as shown. Notice that both PI Conditioners are controlled by an input PLL clock. In this embodiment, component 802 is controlled by Ck2. Similarly, component 804 is controlled by Ck3. In this example, components 802, 804 are operably coupled to PI Mixer 806. It is to be appreciated that system 800 can replace Phase Interpolator 112, in FIG. 1 to effectively reduce intersymbol interference in data recovery circuit 100 as described above and below.

In Operation

In operation, the inventive system of FIG. 7 works as follows. System 700 takes Ck1 and CK3 as inputs as shown. Initially, the output of Flip-Flop 706—signal S2—is low. However, when Ck2 goes high, it toggles S2 from low to high. Because Ck2's phase is between that of Ck1 and CK3, S2 will change from low to high when Ck1 is high, but before Ck3 goes high. This is an improvement over the current PI Conditioner where S2 changed from low to high when both Ck1 and Ck3 were high, which created 180 degree phase modulation.

Accordingly, when S2 is low, Ck1 will be outputted from system 700 as signal A, and Ck3 will be outputted as signal B. However, when S2 toggles to high, Ck3 will be outputted from system 700 as signal A, and Ck1 will be outputted as signal B.

Referring now to FIG. 8, it is to be appreciated that output signals A and B are subsequently sent to Mixer 806, which also takes as input signals C and D, which are computed in a similar fashion using component 804, which takes Ck2 and Ck4 as inputs, and is clocked by Ck3. Mixer 806 subsequently outputs intersymbol interference equalized PI output clocks $\phi 1$ and $\phi 3$ as shown.

Exemplary Method

Figure 9:
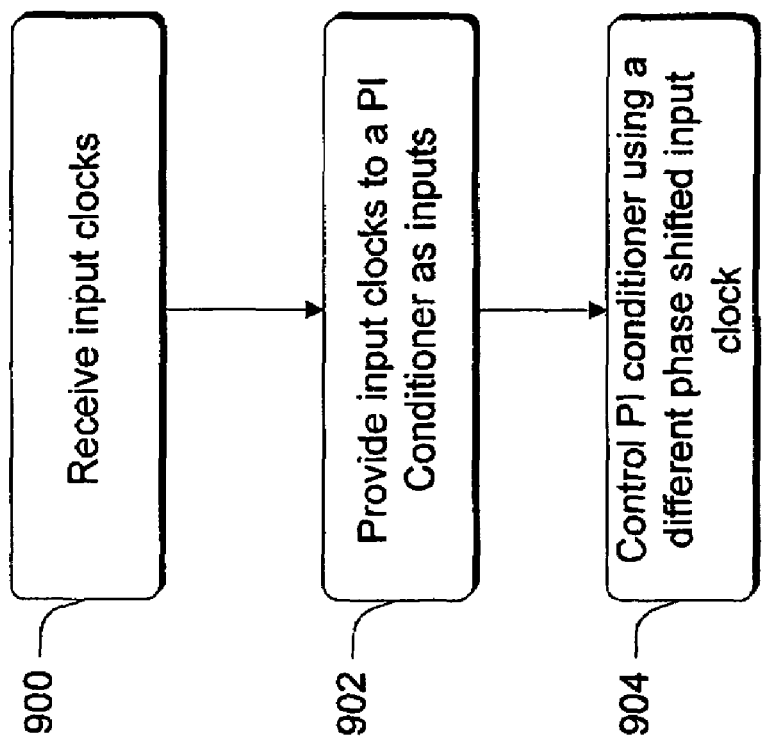
FIG. 9 illustrates a flow diagram that describes acts in accordance with one embodiment.

FIG. 9 is a flow diagram that describes acts in accordance with one embodiment. The method can be implemented in connection with any suitable hardware, software, firmware or combination thereof. In but one embodiment, the method can be implemented in connection with circuits, such as those described above.

At 900, input clocks are received. Four Phase Rx PLL clocks, described above, are but one example of suitable input clocks. As such, it is to be appreciated that other types of input clocks can be used without departing from the spirit and scope of the claimed embodiments. The input clocks are provided to a PI Conditioner, at 902. PI Conditioner 700, described above, is but one example of such a PI Conditioner. As such, other PI Conditioners can be used without departing from the spirit and scope of the claimed embodiments. At 904, the PI Conditioner is controlled using a phase shifted input clock that is different from the input clocks taken as input by the PI Conditioner. FIG. 7 illustrates but one example of a PI Conditioner that is controlled with a different phase shifted input clock. In FIG. 7, PI Conditioner 700 is provided with input clocks Ck1 and Ck3, and is controlled by input clock Ck2, which is phase shifted from both Ck1 and Ck3. As noted above, by controlling PI Conditioner with Intersymbol Interference Equalization 700 with input clock Ck2, intersymbol interference during the inter-quadrant switch is reduced or minimized.

Implementation Example

In the discussion that follows, an exemplary implementation example is described in which the various embodiments described above can be implemented. It is to be appreciated and understood that this implementation example is not to be used to limit application of the claimed subject matter. Rather, the inventive embodiments can be employed in other scenarios without departing from the spirit and scope of the claimed subject matter.

The system described just below is that of a PCI (Peripheral Component Interconnect) Express system which conforms to the PCI Express™ Base Specification Revision 1.1, dated Mar. 28, 2005. It is to be appreciated and understood that the inventive embodiments can be utilized in other systems, other than PCI Express systems, without departing from the spirit and scope of the claimed subject matter. These other systems can include, by way of example and not limitation, systems that utilize data recovery schemes in systems that run at data transfer rates of 1 GB/s or higher. Specific, non-limiting examples of other systems include, by way of example and not limitation, Serial Advanced Technology Attachment (ATA), Serial Digital Video Out (SDVO), Unified Display Interface (UDI) and High-Definition Multimedia Interface (HDMI) systems.

Portions of the discussion that appears just below have been incorporated from the PCI Express™ Base Specification Revision 1.1.

PCI Express is a high performance, general purpose I/O interconnect defined for a wide variety of computing and communication platforms. PCI Express maintains some PCI attributes, such as its usage model, load-store architecture, and software interfaces, whereas its parallel bus implementation is replaced by a highly scalable, fully serial interface.

Figure 10:
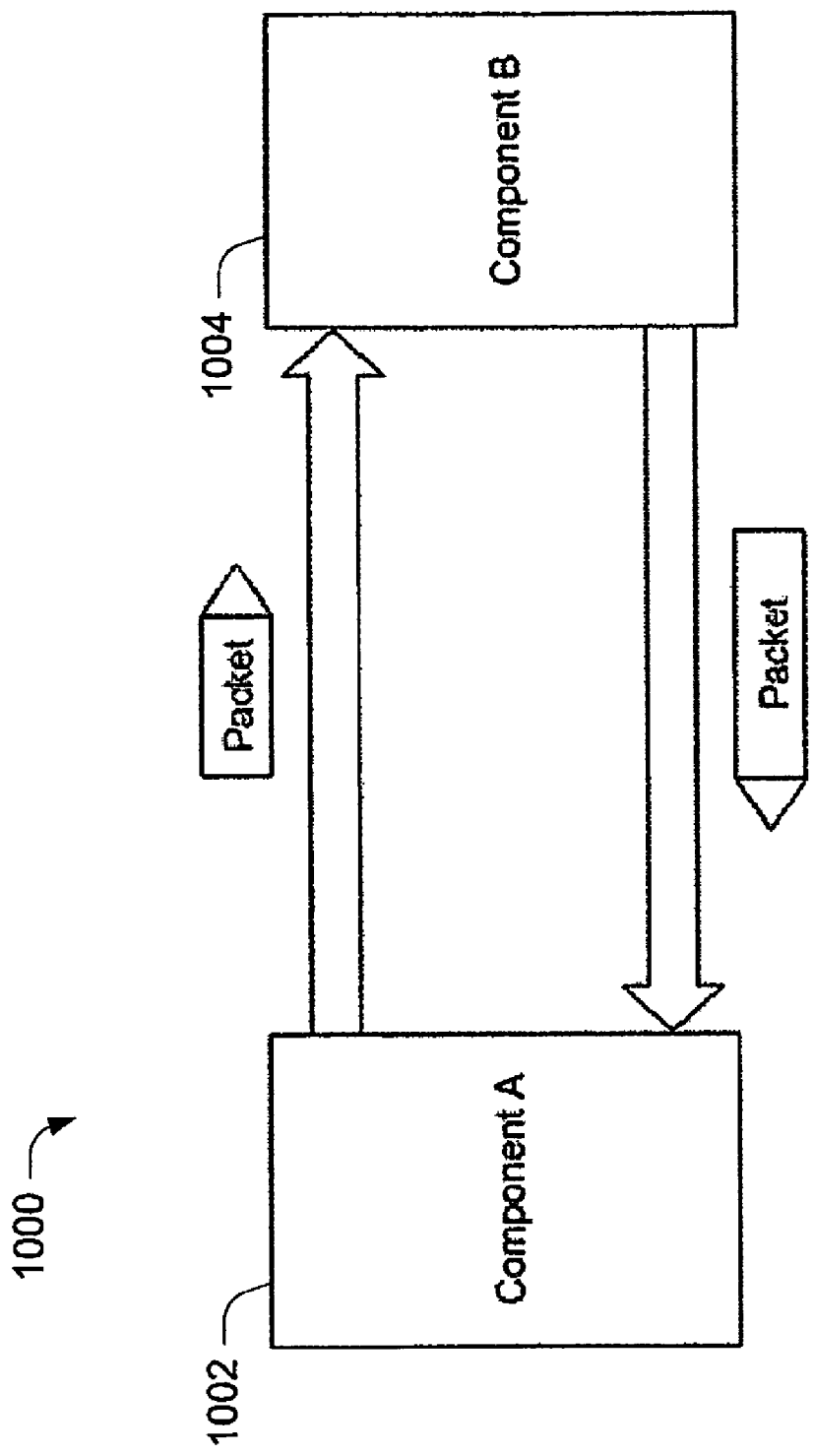
FIG. 10 illustrates a PCI Express Link in connection with which one or more embodiments can be employed.

FIG. 10 illustrates, generally at 1000, a basic PCI Express concept known as a Link. A Link represents a dual-simplex communications channel between two components 1002, 1004. The fundamental PCI Express Link consists of two, low-voltage, differentially driven signal pairs: a Transmit pair and a Receive pair. A data clock is embedded using an encoding scheme to achieve very high data rates.

Figure 11:
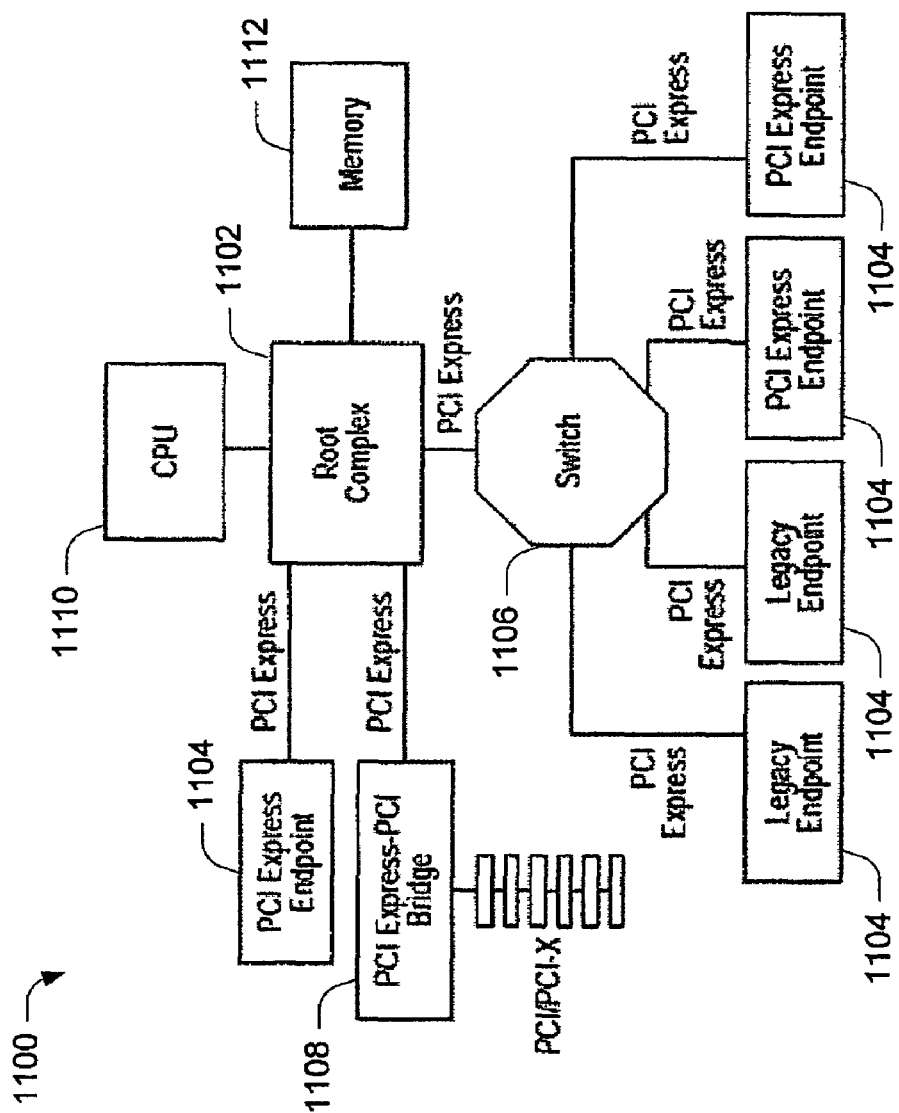
FIG. 11 illustrates an exemplary PCI Express fabric topology in connection with which one or more embodiments can be employed.

A PCI Express fabric is composed of point-to-point Links that interconnect a set of components. One example of a fabric topology is shown in FIG. 11, generally at 1100. This figure illustrates a single fabric instance referred to as a hierarchy—composed of a Root Complex (RC) 1102, multiple Endpoints (I/O devices) 1104, a Switch 1106, and a PCI Express-PCI Bridge 1108, all interconnected via PCI Express Links. Topology 1100 also includes, in this example, CPU 1110 and memory 1112.

Root Complex (RC) 1102 denotes the root of an I/O hierarchy that connects the CPU/memory 1110/1112 subsystem to the I/O. As illustrated in FIG. 11, a Root Complex may support one or more PCI Express Ports. Each interface defines a separate hierarchy domain each of which may be composed of a single Endpoint or a sub-hierarchy containing one or more Switch components and Endpoints.

An Endpoint 1104 refers to a type of device that can be the Requester or Completer of a PCI Express transaction either on its own behalf or on behalf of a distinct non-PCI Express device (other than a PCI device or Host CPU), e.g., a PCI Express attached graphics controller or a PCI Express-USB host controller. Endpoints are classified as either legacy, PCI Express, or Root Complex Integrated Endpoints.

A Switch 1106 is defined as a logical assembly of multiple virtual PCI-to-PCI Bridge devices.

Figure 12:
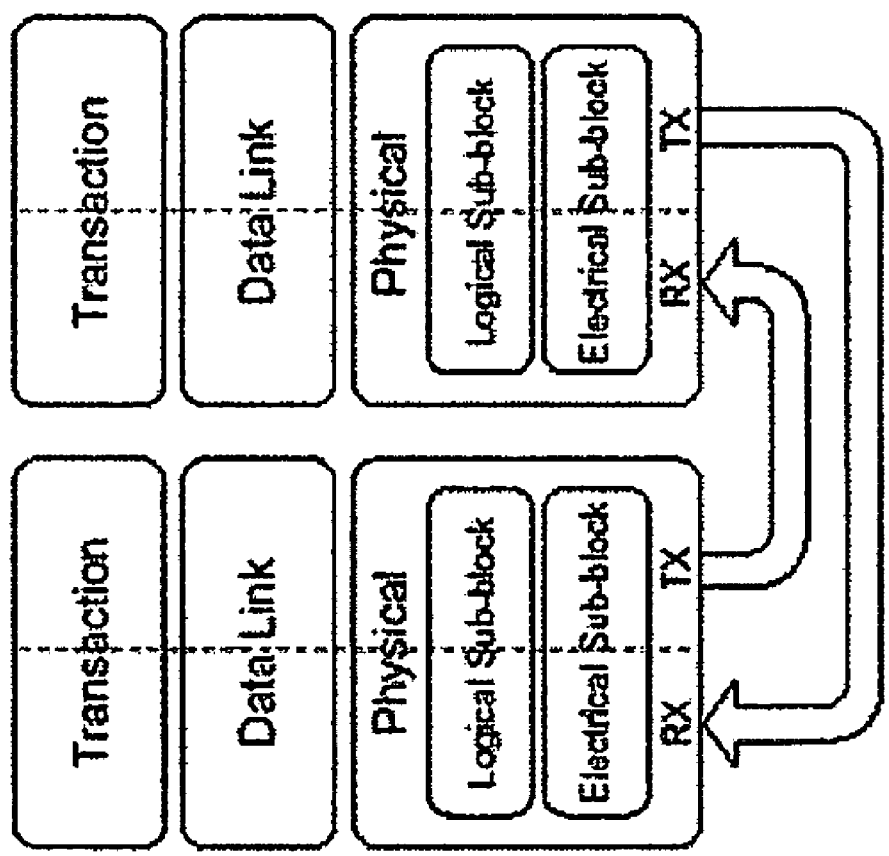
FIG. 12 illustrates a layering overview that describes a PCI Express architecture in connection with which one or more embodiments can be employed.

FIG. 12 provides a layering overview that specifies the PCI Express architecture in terms of three discrete logical layers: the Transaction Layer, the Data Link Layer, and the Physical Layer. Each of these layers is divided into two sections: one that processes outbound (to be transmitted) information and one that processes inbound (received) information, as shown in FIG. 12.

PCI Express uses packets to communicate information between components. Packets are formed in the Transaction and Data Link Layers to carry the information from the transmitting component to the receiving component. As the transmitted packets flow through the other layers, they are extended with additional information necessary to handle packets at those layers. At the receiving side the reverse process occurs and packets get transformed from their Physical Layer representation to the Data Link Layer representation and finally (for Transaction Layer Packets) to the form that can be processed by the Transaction Layer of the receiving device.

The upper Layer of the architecture is the Transaction Layer. The Transaction Layer's primary responsibility is the assembly and disassembly of Transaction Layer Packets (TLPs). TLPs are used to communicate transactions, such as read and write, as well as certain types of events. The Transaction Layer is also responsible for managing credit-based flow control for TLPs.

The middle Layer in the stack, the Data Link Layer, serves as an intermediate stage between the Transaction Layer and the Physical Layer. The primary responsibilities of the Data Link Layer include Link management and data integrity, including error detection and error correction. The transmission side of the Data Link Layer accepts TLPs assembled by the Transaction Layer, calculates and applies a data protection code and TLP sequence number, and submits them to the Physical Layer for transmission across the Link. The receiving Data Link Layer is responsible for checking the integrity of received TLPs and for submitting them to the Transaction Layer for further processing. On detection of TLP error(s), this Layer is responsible for requesting retransmission of TLPs until information is correctly received, or the Link is determined to have failed.

The Physical Layer includes all circuitry for interface operation, including driver and input buffers, parallel-to-serial and serial-to-parallel conversion, PLL(s), and impedance matching circuitry. It includes also logical functions related to interface initialization and maintenance. The Physical Layer exchanges information with the Data Link Layer in an implementation-specific format. This Layer is responsible for converting information received from the Data Link Layer into an appropriate serialized format and transmitting it across the PCI Express Link at a frequency and width compatible with the device connected to the other side of the Link.

The Phase Interpolator with Intersymbol Interference Equalization, described above, resides at this layer of the PCI Express system.

CONCLUSION

The above-described embodiments can be utilized in high-speed serial I/O data recovery circuits to recover data signals that have become distorted due to noise or attenuation. The illustrated and described embodiments can be utilized to address and mitigate the phase push-out due to intersymbol interference.

What is claimed is:

1. A circuit comprising:
   a phase interpolator-based data recovery circuit comprising:
   a first clock signal;
   a second clock signal;
   a third clock signal;
   a fourth clock signal;
   a first input clock controlled phase interpolator conditioner, wherein the first input clock controlled interpolator conditioner comprises a first set of digital 2-to-1 MUXs, wherein the first set of MUXs receive the first and third clock signal and, wherein the first set of MUXs are coupled to a first flip-flop, wherein said first flip-flop is configured to receive the second input clock signal and a first control signal as input;
   a second input clock controlled phase interpolator conditioner, wherein the second input clock controlled interpolator conditioner comprises a second set of digital 2-to-1 MUXs, wherein the second set of MUXs receive the second and fourth clock signal and, wherein the second set of MUXs are coupled to a second flip-flop, wherein said second flip-flop is configured to receive the third input clock signal and a second control signal as input, wherein the first control signal and the second control signal are independent of each other; and
   a phase interpolator mixer coupled to the first and second input clock controlled phase interpolator conditioners.

2. The circuit of claim 1, wherein each said flip-flop is configured to control each respective set of MUXs.

3. The circuit of claim 1, wherein each set of MUXs are coupled to an amplifier.

4. A method comprising:
   receiving at least a first clock signal, a second clock signal, a third clock signal and a fourth clock signal;
   providing the first and third clock signals to a first phase interpolator conditioner as inputs, wherein the first phase interpolator conditioner comprises a first set of digital 2-to-1 MUXs, wherein the first set of MUXs receive the first and third clock signal and, wherein the first set of MUXs are coupled to a first flip-flop, wherein said first flip-flop is configured to receive the second input clock signal and a first control signal as input; and
   providing the second and forth clock signals to a second phase interpolator conditioner as inputs, wherein the second phase interpolator conditioner comprises a second set of digital 2-to-1 MUXs, wherein the second set of MUXs receive the second and fourth clock signal and, wherein the second set of MUXs are coupled to a second flip-flop, wherein said second flip-flop is configured to receive the third input clock signal and a second control signal as input, wherein the first control signal and the second control signal are independent of each other.

5. The method of claim 4, wherein the phases of the first clock signal, the second clock signal, the third clock signal and the fourth clock signal received as input are different.

6. The method of claim 4, wherein the input clock signals are generated by a 4-phase Rx PLL clocks.

7. A system comprising:
   a transmit/receive circuitry, wherein the transmit and receive circuitry is configured to transmit and receive data signals;
   a data recovery circuitry operably coupled to the transmit/receive circuitry, wherein the data recovery circuit comprises a phase interpolator-based data recovery circuit comprising:
   a first clock signal;
   a second clock signal;
   a third clock signal;
   a fourth clock signal;
   a first input clock controlled phase interpolator conditioner, wherein the first input clock controlled interpolator conditioner comprises a first set of digital 2-to-1 MUXs, wherein the first set of MUXs receive the first and third clock signal and, wherein the first set of MUXs are coupled to a first flip-flop, wherein said first flip-flop is configured to receive the second input clock signal and a first control signal as input;
   a second input clock controlled phase interpolator conditioner, wherein the second input clock controlled interpolator conditioner comprises a second set of digital 2-to-1 MUXs, wherein the second set of MUXs receive the second and fourth clock signal and, wherein the second set of MUXs are coupled to a second flip-flop, wherein said second flip-flop is configured to receive the third input clock signal and a second control signal as input, wherein the first control signal and the second control signal are independent of each other; and
   a phase interpolator mixer coupled to the first and second input clock controlled phase interpolator conditioners.

8. The system of claim 7, wherein the system comprises a PCI Express system.

* * * * *